(12) United States Patent
Schumacher et al.

(10) Patent No.: US 8,618,809 B2
(45) Date of Patent: Dec. 31, 2013

(54) ELECTRICAL ISOLATION DETECTION WITH ENHANCED DYNAMIC RANGE

(75) Inventors: Ryan W. Schumacher, Fargo, ND (US); Perry K. White, Fargo, ND (US)

(73) Assignee: Deere & Company, Moline, IL (US)

( * ) Notice: Subject to any disclaimer, the term of this patent is extended or adjusted under 35 U.S.C. 154(b) by 367 days.

(21) Appl. No.: 12/893,164

(22) Filed: Sep. 29, 2010

(65) Prior Publication Data
US 2011/0304339 A1 Dec. 15, 2011

Related U.S. Application Data

(60) Provisional application No. 61/354,816, filed on Jun. 15, 2010.

(51) Int. Cl.
*G01R 31/14* (2006.01)
(52) U.S. Cl.
USPC ............ 324/509; 324/503; 324/510; 324/551
(58) Field of Classification Search
USPC ......... 324/500, 503, 509, 510, 512, 528, 537, 324/551
See application file for complete search history.

(56) References Cited

U.S. PATENT DOCUMENTS

| | | | | |
|---|---|---|---|---|
| 5,721,497 A | * | 2/1998 | Novak | 326/30 |
| 5,751,524 A | * | 5/1998 | Swindler | 361/42 |
| 7,459,914 B2 | | 12/2008 | Lindsey et al. | |
| 2004/0212371 A1 | | 10/2004 | Nomoto et al. | |
| 2009/0001993 A1 | | 1/2009 | Lindsey et al. | |
| 2009/0134881 A1 | * | 5/2009 | Tachizaki | 324/551 |
| 2009/0147415 A1 | * | 6/2009 | Lazarovich et al. | 324/509 |
| 2009/0160454 A1 | * | 6/2009 | Johansson et al. | 324/509 |
| 2009/0323233 A1 | | 12/2009 | Shoemaker et al. | |
| 2010/0207635 A1 | * | 8/2010 | Plagens et al. | 324/509 |
| 2011/0068802 A1 | * | 3/2011 | Roscoe et al. | 324/509 |
| 2011/0125433 A1 | * | 5/2011 | Schaefer et al. | 702/63 |
| 2011/0218745 A1 | * | 9/2011 | Hasan et al. | 702/58 |

OTHER PUBLICATIONS

Notification of Transmittal of the International Search Report and the Written Opinion of the International Searching Authority, or the Declaration, Oct. 5, 2011, 14 pages.

* cited by examiner

*Primary Examiner* — Jermele M Hollington
*Assistant Examiner* — Adam Clarke (57) ABSTRACT

A bus terminal is isolated from ground potential during normal operation of the vehicle. A first current is applied to the bus terminal. A current level detector is arranged to detect a first level of the first current, or a corresponding observed voltage level, that exists or flows from the bus terminal to ground. A compensator is configured to compensate for a range in the detected first level by applying a corresponding compensating voltage level to a first resistor coupled to the current level detector. An electronic data processor is capable of estimating a first isolation level between the bus terminal and ground based on the detected first level.

18 Claims, 6 Drawing Sheets

| Output A (e.g., CM_NI_V1) | Output B (e.g., CM_I_V2) | If Starting Offset = | Change Offset to | Signal for Determining Leakage Current |
|---|---|---|---|---|
| Lower | Lower | X | X | X |
| Lower | In | -1.8V | Don't Change | Output B (e.g., CM_I) |
| Lower | In | 0V | Don't Change | Output B (e.g., CM_I) |
| Lower | In | +1.8V | Don't Change | Output B (e.g., CM_I) |
| Lower | Higher | -1.8V | 0V | restart with new offset |
| Lower | Higher | 0V | +1.8V | restart with new offset |
| Lower | Higher | +1.8V | X | X |
| In | Lower | -1.8V | Don't Change | Output A (e.g., CM_NI) |
| In | Lower | 0V | Don't Change | Output A (e.g., CM_NI) |
| In | Lower | +1.8V | Don't Change | Output A (e.g., CM_NI) |
| In | In | -1.8V | Don't Change | Output A + Output B (e.g., CMNI_V1 + CMI_V2) |
| In | In | 0V | Don't Change | Output A + Output B (e.g., CMNI_V1 + CMI_V2) |
| In | In | +1.8V | Don't Change | Output A + Output B (e.g., CMNI_V1 + CMI_V2) |
| In | Higher | -1.8V | X | X |
| In | Higher | 0V | X | X |
| In | Higher | +1.8V | X | X |
| Higher | Lower | -1.8V | -1.8V | restart with new offset |
| Higher | Lower | 0V | 0V | restart with new offset |
| Higher | Lower | +1.8V | X | X |
| Higher | In | -1.8V | X | X |
| Higher | In | 0V | X | X |
| Higher | In | +1.8V | X | X |
| Higher | Higher | X | X | X |

ELECTRICAL ISOLATION DETECTION WITH ENHANCED DYNAMIC RANGE

This document (including the drawings) claims priority and the benefit of the filing date based on U.S. provisional application No. 61/354,816 filed Jun. 15, 2010 under 35 U.S.C. §119 (e), where the provisional application is hereby incorporated by reference herein.

FIELD OF THE INVENTION

This invention relates to a method and system for electrical isolation detection with enhanced dynamic range for sensing of leakage current between a voltage bus terminal and ground (or chassis reference).

BACKGROUND OF THE INVENTION

Electric and hybrid vehicles may have one or more voltage buses (e.g., high voltage buses) that are isolated from the ground and chassis reference of the vehicle during normal operation. However, if an electrical short or another electrical problem occurs in vehicle circuitry or electromechanical devices (e.g., motors or generators), one or more voltage buses may apply or leak undesired electrical energy to the chassis of the vehicle or vehicle electronics, which can detract from vehicle performance or reliability. The level of observed leakage current may vary over an extensive range depending upon the particular facts and circumstances related to the electrical short or other electrical problem. To accommodate the extensive range of possible observed leakage current, certain prior art approaches can result in costly, bulky or complicated circuitry to accurately measure isolation between the voltage bus and the chassis. Thus, there is need to detect degraded electrical isolation between one or more voltage buses and the chassis of the vehicle over an extended range of possible observed leakage current without undue cost, bulkiness or complication.

SUMMARY OF THE INVENTION

In accordance with one embodiment of the invention, a system for detecting electrical isolation between a bus terminal and ground (or chassis reference) on a vehicle supports an enhanced dynamic range for sensing of leakage current between a voltage bus terminal and ground (or chassis reference). A bus terminal is isolated from ground and chassis reference during normal operation of the vehicle. A first current is applied to the bus terminal. A detector or measuring circuit is arranged to detect a first level of the first current, or a corresponding observed voltage level, that flows or exists from the bus terminal to ground (or chassis reference). A compensator or data processing system is configured to compensate for a range in the first level, or the corresponding observed voltage associated with the detected first level, by applying a corresponding compensating voltage level to a resistive network. An electronic data processor is capable of estimating a first isolation level between the bus terminal and ground (or the chassis reference) based on the detected first level.

DESCRIPTION OF THE PREFERRED EMBODIMENT

A bus terminal (e.g., 21) has a voltage potential with respect to ground, a vehicle chassis, or both. As used in this document, "ground" may refer to one or more of the following: (1) Earth ground, (2) chassis reference (e.g., vehicle chassis reference) or potential of the vehicle chassis with respect to Earth ground or another reference point, or (3) Earth ground and chassis reference, where the chassis reference equals or is substantially equivalent to Earth ground and where substantially equivalent means plus or minus ten percent of any value or electrical parameter (e.g., voltage). As used in this document, isolation refers to resistance, impedance, reactance, conductivity, or another measurement of the level or degree of electrical isolation between any observed circuit point (e.g., vehicle bus terminal 21) and ground (e.g., chassis reference). Degraded isolation refers to any level of resistance or impedance that is less than a normal level or base-line reference level between the vehicle bus terminal and ground (e.g., chassis reference) or any level of conductivity that is greater than normal level, for example. A short circuit means that the degraded isolation is materially impaired such that there is a generally low resistance or low impedance path of conductivity between the vehicle bus terminal and ground (e.g., chassis reference). In one example, a generally low resistance path may mean less than twenty-five thousand ohms, although other threshold levels for low resistance may be appropriate and fall within the scope of the disclosure and claims.

Figure 1:
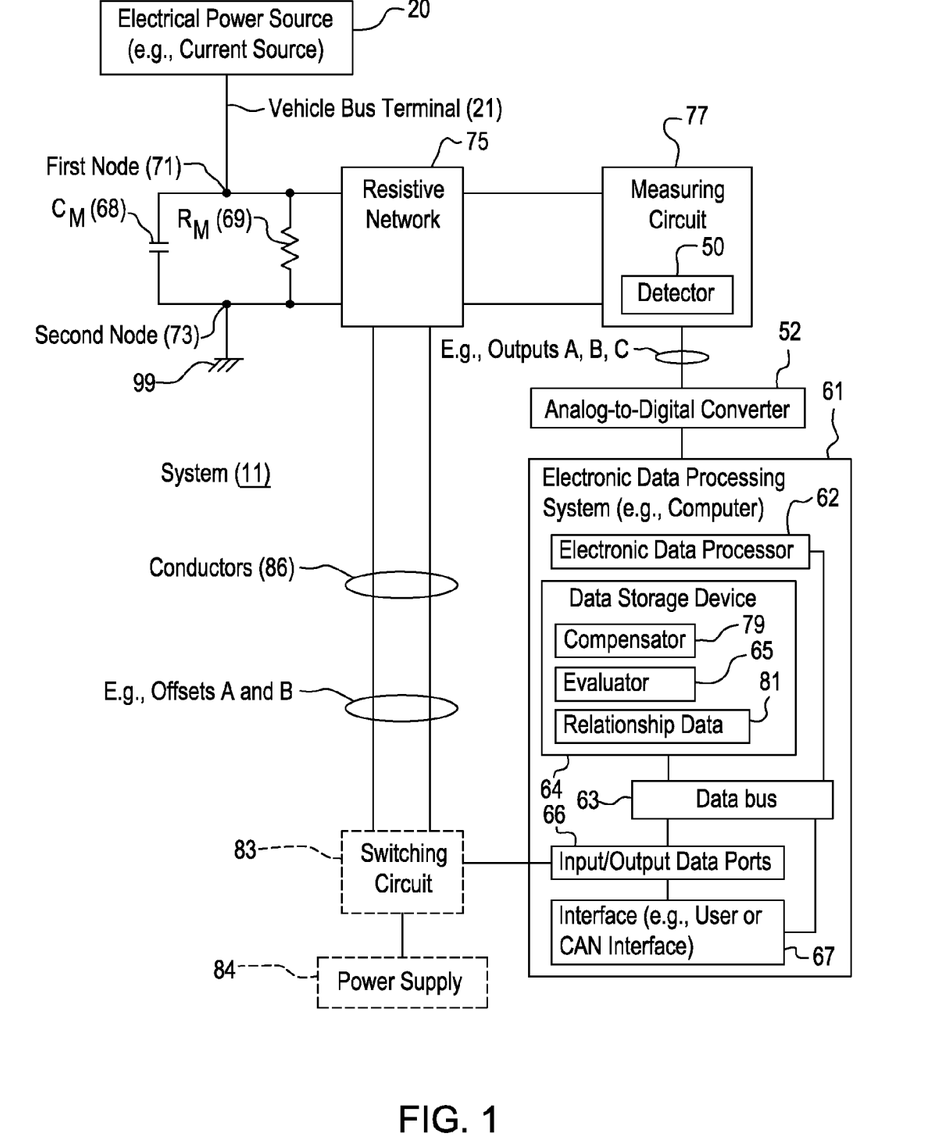
FIG. 1 is a block diagram of a first embodiment of a system for electrical isolation detection between a voltage bus terminal and ground (or chassis reference).

In accordance with one embodiment of the invention, FIG. 1 shows a block diagram of a system 11 for detecting electrical isolation between a bus terminal 21 and ground 99 or vehicle chassis on a vehicle. The system 11 of FIG. 1 supports an enhanced dynamic range for sensing of leakage current between a bus terminal 21 and ground 99 (or chassis reference).

Figure 2:
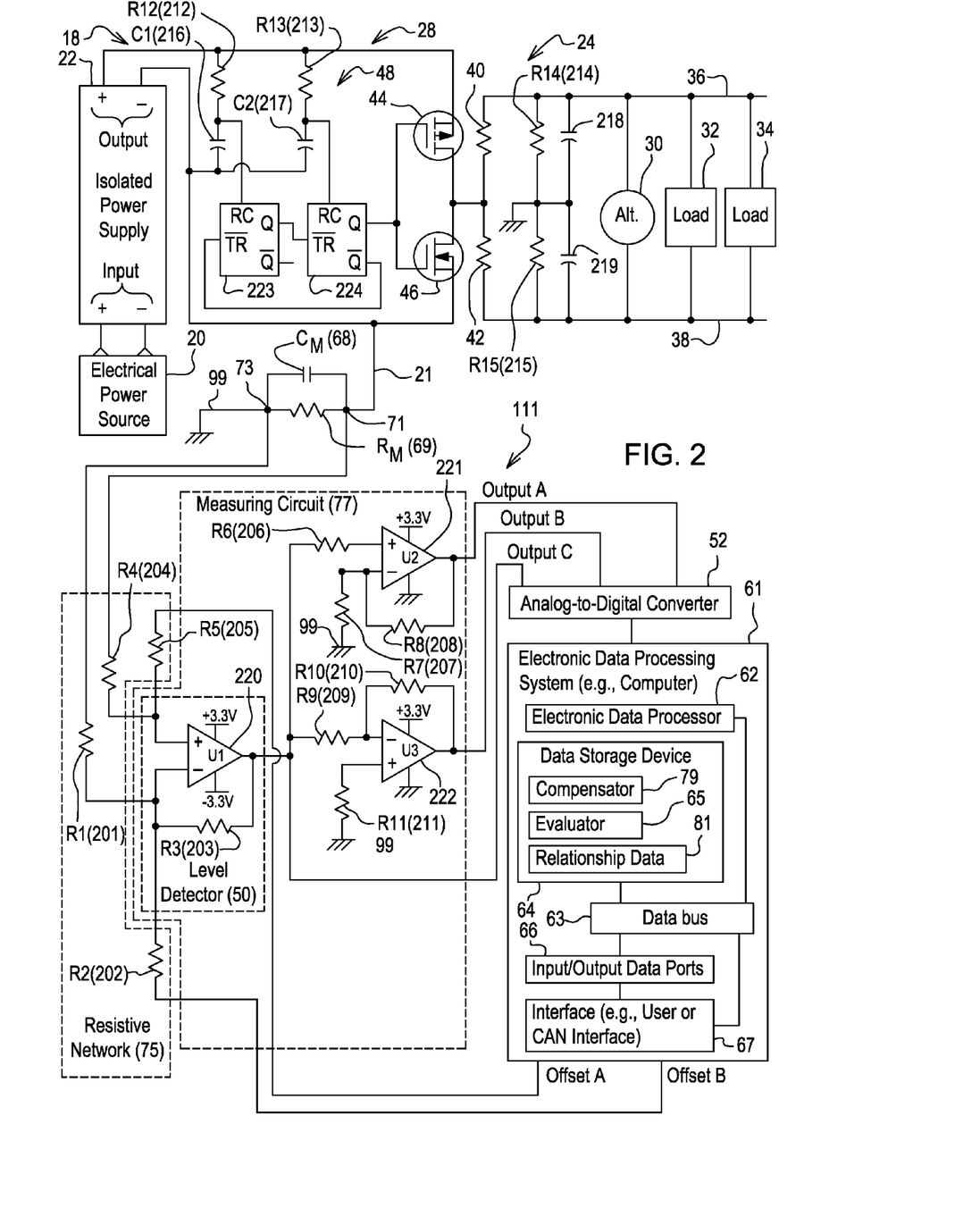
FIG. 2 is a block diagram of a second embodiment of a system for electrical isolation detection between a voltage bus terminal and ground (or chassis reference).

An electrical power source 20 provides electrical energy to one or more bus terminals 21, either directly or indirectly through an isolated power supply 22 (as shown in FIG. 2). One bus terminal 21 or output of the power source 20 is coupled to a measurement resistor 69 ($R_M$), with a known resistance value, at a first node 71. In one embodiment, a measurement capacitor 68 ($C_M$) is connected in parallel with the measurement resistor 69. The measurement capacitor 68 is connected in parallel with the measurement resistor 69 and attenuates an alternating current component or a high frequency component in the signal applied to the measurement capacitor 68. A second node 73 of the measurement resistor 69 is coupled to ground 99 or chassis reference of the vehicle. The measurement resistor 69 is coupled to measuring circuit 77 via a resistive network 75. The measuring circuit 77 comprises a detector 50 for detecting at least one of a current level in the measurement resistor 69 or a corresponding observed voltage potential across the measurement resistor 69. The measuring circuit 77 is connected to an analog-to-digital converter 52. In turn, an output of the analog-to-digital converter 52 is connected to an electronic data processing system 61 (e.g., computer). The electronic data processing system 61, or the input/output data ports 66, may be coupled to switching circuit 83. The electronic data processing system 61 comprises a compensator 79 or other software instructions for determining an offset or compensating voltage and when to apply such offset of compensating voltage to the resistive network 75 or otherwise. The switching circuit 83 selectively connects or couples an offset voltage or compensating voltage of a power supply 84 to conductors 86 or transmission lines that are connected to at least the resistive network 75, the first node 71, or the second node 73.

The electrical power source 20 may comprise a battery, dry cells, a fuel cell, or another source of electrical energy (e.g., direct current voltage supply).

The resistive network 75 may comprise two or more resistors coupled together in series, in parallel, in a ladder configuration, a voltage divider configuration, or another network configuration.

The measuring circuit 77 may comprise an arrangement of one or more amplifiers or amplifier circuits. For example, the amplifiers may be arranged in inverting or non-inverting configurations, or cascaded in successive stages. The input of at least one amplifier (e.g., detector 50) is connected in the measuring circuit 77 and is coupled to the resistive network 75. The measuring circuit 77 comprises a level detector 50.

As shown in FIG. 1, the detector 50 comprises a voltage detector, a voltage meter, or voltage measuring device coupled, directly or indirectly, to the measurement resistor 69. For example, the detector 50 may be coupled indirectly to the measurement resistor 69 via the resistive network 75. If the detector 50 is configured to measure the voltage level between the first node 71 and the second node 73, or across the measurement resistor 69, the detector 50 may use the electronic data processing system 61 or another technique to convert a measured or observed voltage level to a corresponding current level through the application of Ohm's law or standard circuit analysis equations. In an alternate embodiment, the detector 50 comprises a current level detector 50 or ammeter that is inductively coupled in a circuit path between the measurement resistor 69 and ground 99 or chassis reference in a manner suitable to measure the current level flowing through the measurement resistor 69.

The electronic data processing system 61 (e.g., computer) comprises an electronic data processor 62, a data storage device 64, one or more input/output data ports 66 (or data ports 66), and an interface 67 (e.g., user interface) coupled to a data bus 63. The electronic data processor 62, the data storage device 64, one or more data ports 66, and the interface 67 or capable of communicating with each other via the data bus 63.

The data processor 62 may comprise a microprocessor, a microcontroller, a programmable logic array, an application specific integrated circuit, or another electronic device for processing, inputting, or outputting data.

The data storage device 64 may comprise electronic memory, non-volatile random access memory, optical data storage, magnetic data storage, or another device for storing data. The data storage device 64 may store program instructions, such as the look-up table of FIG. 6, or other data records, files, database, or rules for generating compensation voltage (e.g., compensating voltage level or corrective signals) for application to the measurement resistor 69 or the resistive network 75.

The interface 67, such as a user interface, may be coupled to an input/output port 66 or directly to the data bus 63. A user interface comprises a keyboard, a keypad, a switch, a display, a pointing device (e.g., electronic mouse or track ball), or another device. In one embodiment, the interface 67 comprises a vehicle data bus interface, such as network device or element capable of communicating data messages or status messages over a vehicle data bus (e.g., a CAN (controller area network) data bus). The interface 67 may support communication of data messages, status messages via a vehicle bus to support display or alerting of a user via an on-vehicle computer or display coupled to the vehicle data bus, for example.

The data processing system may convert measured or observed voltage across the measurement resistor 69, into corresponding current levels, where the detector 50 may provide the observed voltage. Further, the data processing system may statistically process observed measurements (e.g., voltage or current measurements), average observed measurements over time (e.g., an RC (resistance/capacitance) decay period for a circuit), or discard certain transient motor currents (e.g., when the motor is started from rest).

In one embodiment, the data processing system 61 may support collecting and processing observed measurements in a charge mode, a discharge mode, or both. In a charge mode, a charge is placed on a vehicle bus (e.g., 21) and the data processor 62 or evaluator 65 evaluates the amount of the charge that leaks off, decays or dissipates over time on the vehicle bus to determine whether the isolation between the bus terminal 21 and ground 99 (or chassis reference) is degraded. For example, if the charge leaks off or is depleted more rapidly than under normal operation of the vehicle electronics or circuitry, the isolation may be degraded. In a discharge mode, a charge is removed from the vehicle bus and the data processor 62 or evaluator 65 evaluates the amount of charge that remains on the vehicle bus (e.g., 21) to determine whether the isolation between the bus terminal 21 and ground 99 (or chassis reference) is degraded. For example, if the charge that remains is depleted more rapidly than under normal operation of the vehicle electronics or circuitry, the isolation may be degraded.

The data storage device 64 may store software, program instructions, or data. For example, the data storage device 64 may store a compensator 79 or compensation software instructions, an evaluator 65 or evaluation software instructions, and relationship data 81. The relationship data 81 relates to the relationship between various observed voltage (or corresponding current states in the system) associated with the measurement resistor 69 and a corresponding offset voltages or compensating voltage levels for application to the first node 71, the second node 73, or the resistive network 75.

A bus terminal 21 is isolated from ground 99 (and chassis reference) during normal operation of the vehicle electronics or electrical system. A first current is applied to the bus terminal 21.

A detector 50 (e.g., voltage or current level detector 50) is arranged to detect a first level of the first current, or a corresponding observed voltage level that is proportional to or otherwise indicative of the first current via a mathematical relationship or circuit analysis equation. In one embodiment, the detector 50 detects the first current, or its first derivative, based on one or more of the following: (1) the first current that possibly flows between the bus terminal 21 and ground 99 (or to the chassis reference) during abnormal operation (or other than normal operation) of the vehicle electronics or electrical system, or (2) a corresponding observed voltage between the first node 71 and the second node 73 of the measurement resistor 69. The detector 50 or the data processing system 61 may determine the first level of the first current from a corresponding observed voltage between the bus terminal 21 and ground 99 by applying Ohm's law, a look-up table, mathematical equations, circuit analysis, a database, or other relationship data 81 stored in the data storage device 64. A compensator 79 or data processing system 61 is configured to compensate for a range in an observed voltage associated with or corresponding to the detected first level. The compensator 79 is arranged to apply a corresponding compensating voltage level to a resistive network 75 or to the first node 71 and second node 73. An electronic data processor 62 is capable of estimating a first isolation level between the bus terminal 21 and ground 99 (or chassis reference) based on the detected first level, before, after or during such compensation or application of the compensating voltage.

A detector 50 is arranged to detect a first level of the first current, or a first derivative current based on or corresponding to the voltage between the first node 71 and the second node 73, or the first current, that flows between the bus terminal 21 and ground 99 (or chassis reference). For example, the first current may flow from the bus terminal 21 to ground 99. The detector 50 may operate in accordance with various procedures, which may be applied alternately or cumulatively. Under a first procedure, the detector 50 may comprise an ammeter or another device that measures current by inductive or direct coupling between the bus terminal 21 (electrical power source 20) and ground 99.

Under a second procedure, the detector 50 may determine the current that flows through the measurement resistor 69 or both the measurement resistor 69 and the measurement capacitor 68 by measuring the voltage potential across the measurement resistor 69. For example, if the voltage potential across the resistor is only direct current voltage, Ohm's law may be used to determine the current flow to ground 99 and any direct current flow through the measurement capacitor 68 can be ignored because the measurement capacitor 68 may present a high impedance to the direct current voltage. Ohm's law holds that voltage across the measurement resistor 69 equals the current flowing through the resistor multiplied by the resistance value of the resistor.

A compensator 79 comprises software instructions, hardware or both for compensating for the effects of variations that would otherwise occur in the observed current level or first current level observed by the current level detector 50 and associated with the measurement resistor 69. In one embodiment, the compensator 79 is configured to compensate for a range in the detected first level by applying a corresponding compensating voltage level to the resistive network 75. In another embodiment, the compensator 79 can apply offset voltages or compensating voltages to the first node 71 and the second node 73 to keep detected or observed voltages (or corresponding current levels) associated with the measurement resistor 69 within a limited voltage range suitable for conversion by an analog-to-digital converter 52 and subsequent data processing (e.g., to determine current level in the measurement resistor 69, or a possible short circuit, ground fault or degraded isolation between the vehicle bus terminal 21 and chassis reference) by a digital electronic data processing system 61.

The detector 50, in conjunction with the data processing system or the evaluator 65, determines the estimated isolation level between the bus terminal 21 and ground 99 (or chassis reference), while the compensator 79 compensates for variations that would otherwise occur to increase the dynamic range of measurement for the detector 50 and the analog-to-digital converter 52. The system supports enhanced or greater input voltage range for the analog-to-digital converter 52 by applying a compensating or offset voltage to the resistive network 75 to place a greater range of observed voltages within the normal or standard voltage input window or voltage input range of the analog-to-digital converter 52. Accordingly, the system is well suited for processing observed current and voltage ranges of greater dynamic range or greater variation than otherwise possible.

If the data processing system 61 or evaluator 65 determines that estimated isolation level between the bus terminal 21 and ground 99 is less than a minimum threshold, the isolation level qualifies as a ground fault, a short circuit, or degraded isolation that is indicative of abnormal or deficient operation of the vehicle electrical system. However, if the evaluator 65 or electronic data processing system 61 determines that the estimated isolation level between the bus terminal 21 and ground 99 is greater than or equal to a minimum threshold, the estimated isolation level is indicative of normal operation of the vehicle electrical system.

An interface 67 is capable of communicating with the data processor 62. The interface 62 (e.g., user interface) is arranged to alert a user of the ground fault or short circuit via a visual alert or an audible alert, where the interface 67 comprises a user interface. The user interface may provide or display an alarm or warning (e.g., audible or visual) to a user, if the current level detector 50 determines that there is a short circuit, ground fault or deficient isolation between the vehicle bus (e.g., 21) and ground 99. Similarly, the user interface may provide or display a normal status indicator (e.g., audible or visual) to a user, if the current level detector 50 determines that the electrical system is operating normally or that there is an absence of a short circuit, ground fault or other deficient isolation between the vehicle bus (e.g., 21) and ground 99.

In an alternate embodiment, the interface 67 may also provide a data message or status message via a vehicle data bus 63 for display on another controller, display or network device coupled to the vehicle data bus 63, as opposed to a user interface connected directly with the electronic data processing system 61.

FIG. 2 illustrates a second embodiment of a system 111 for isolation detection for sensing of a leakage current between a voltage bus and ground (e.g., chassis reference). In particular, FIG. 2 shows illustrative examples of schematics for the resistive network 75, the detector 50 and the measuring circuit 77 of FIG. 1. The system 111 is similar to the system 11 of FIG. 1, except the system 111 of FIG. 2 deletes the switching circuit 83 and power supply 84 of the system 11 of FIG. 1. In addition, FIG. 2 provides an illustrative example of a first vehicle bus (e.g., direct current bus or low voltage direct current bus), a second vehicle bus (e.g., alternating current bus or high voltage direct current bus), and associated components of a vehicle electrical system. Like reference numbers in FIG. 1 and FIG. 2 indicate like elements.

In one embodiment, the resistive network 75 may comprise a first resistor 201 (R1), a second resistor 202 (R2), a third resistor 204 (R4), and a fourth resistor 205 (R5). The first resistor 201 and the third resistor 204 are coupled to the nodes (71, 73) of the measurement resistor 69, whereas the second resistor 202 and the fourth resistor 205 are coupled to the electronic data processing system 61 or the input/output data ports 66 of the data processing system 61. Here, the input/output data ports 63 are configured to generate or supply one or more compensating voltage levels (e.g., Offset A, Offset B, or both). The resistor network 75 provides an suitable network of resistors to support measuring of the voltage or current associated with the measurement resistor 69, with or without the application of compensating voltage levels of offset voltage levels from the data processing system 61.

For example, as shown in more detail in FIG. 2, the measuring circuit 77 may comprise a group of amplifiers (220, 221, 222) or operational amplifiers that accepts samples of observed measurement current or voltages via the resistive network 75 or at observation nodes (e.g., first and second nodes (71, 73) at or near the measurement resistor 69, or at other resistors coupled to the measurement resistor 69). As shown in FIG. 2, the measuring circuit 77 comprises a first amplifier 220, a second amplifier 221, and a third amplifier 222 and associated resistors.

The first node 71 is coupled to a first amplifier 220 via a third resistor 204 of the resistive network 75, whereas the second node 73 is coupled to the first amplifier 220 via a first resistor 201 of the resistive network 75. The first amplifier 220 has a feedback resistor 203 (R3) between the first amplifier input and the first amplifier output for adjusting gain of the first amplifier 220.

The first amplifier output is coupled to an input of a second amplifier 221, an input of a third amplifier 222, and the electronic data processing system 61 (e.g., computer). An input resistor 206 (R6) is connected between the first amplifier output and the input of the second amplifier 221. An input resistor 209 (R9) is connected between the first amplifier output of the input of the third amplifier 222. The second amplifier 221 has a feedback resistor 208 (R8) between the second amplifier input and the second amplifier output for adjusting gain of the second amplifier 221. The third amplifier 222 has a feedback resistor 210 (R10) between the third amplifier input and the third amplifier output for adjusting gain of the second amplifier 221.

As shown in FIG. 2, the second amplifier 221 is non-inverting configuration, whereas the first amplifier 220 is an inverting configuration. One input of the second amplifier 221 is coupled to ground 99 via a biasing resistor 207 (R7), whereas one input of the third amplifier 222 is coupled to ground 99 via a biasing resistor 211 (R11). In an inverting configuration, with an alternating current input signal, the output is one-hundred and eighty (180) degrees out of phase with respect to the input. However, in alternate embodiments, other configurations are possible for the amplifiers within the measuring circuit 77 than those shown.

The first amplifier output, the second amplifier output, and the third amplifier output are coupled to inputs of the data processing system 61 or an analog-to-digital converter 52. The observed voltage levels are provided to the data processing system 61 via the analog-to-digital converter 52. For example, the measuring circuit 77 provides one or more of the following output signals to the analog-to-digital converter 52: Output A, Output B, and Output C.

The data storage device 64 stores a reference relationship data 81 on a relationship between observed voltage levels (e.g., associated with Outputs A, B and C) and corresponding compensating voltage levels. For example, the secondary data storage device 64 stores compensating voltage levels versus observed reference voltage levels as relationship data 81 in at least one of a look-up table, a file, database, and a data record, such as the look-up table of FIG. 6 or otherwise.

The data processor 62 supports communication with the data storage device 64 to determine a compensating voltage level based on an observed voltage level of the compensator 79. In one embodiment, the input/output data ports 66 support the provision, generation, or selection of offset or compensating voltage levels for application to the resistive network 75. Accordingly, the system of FIG. 2 differs from that of FIG. 1, where the input/output data ports 66 are used to control a switching circuit 83 for selecting an appropriate compensating voltage available from a power supply 84. Instead, here in FIG. 2, the input/output ports are capable of generating two or three logic levels required for compensating voltage levels.

In one example, a data port of the input/output data ports 66 is configured for applying a first discrete voltage level or a second discrete voltage level, different from the first discrete voltage level, as the compensating voltage level, to the detector 50 based on an output of the secondary data processor determined through application of the reference data.

In another example, the compensator 79 or data processing system 61 provides a compensating voltage level or offset (e.g., Offset A, Offset B, or both) based upon outputs of the measuring circuit 77 or one or more amplifiers within the measuring circuit 77, for example. The compensating voltage level (e.g., Offset A, Offset B, or both) is well-suited for enhancing the dynamic range of the first current level or other current levels measured by the current level detector 50.

With respect to the vehicle electrical system, the bus terminals 21 are coupled to a converter 28 (or switching assembly) for converting a first voltage on the first bus terminals 21 (e.g., at the voltage level of the power source 20) or from the isolated power supply 22 to a second voltage on a second bus terminals 21. The first bus may comprise a direct current voltage bus with a lower voltage (e.g., direct current voltage) than that of the second bus (e.g., Root Mean Squared (RMS) voltage or direct current voltage). The second bus may comprise an alternating current (AC) bus, a high voltage bus, or a higher voltage direct current (DC) bus. As shown in FIG. 2, the converter 28 comprises a DC-to-AC converter or inverter and the generator comprises an alternator 30. The converter 28 may comprise an inverter or chopper circuit.

However, in an alternate embodiment, the converter 28 may comprise a DC-to-DC converter and the alternator 30 may comprise a generator with its output coupled to a rectifier.

As shown in FIG. 2, the second bus has a higher voltage level than that of the first bus or the power source 20. The second bus may be referred to as a high voltage bus. The second bus (e.g., high voltage bus) is coupled to an alternator 30 (e.g., generator) and one or more loads (32, 34). For example, for a vehicle a high voltage bus refers to equal to or greater than approximately 48 volts direct current or alternating current, although high voltage buses on vehicles may include 300 volts, 600 volts or 750 volts, among other possibilities.

FIG. 2 illustrates an electrical system 18 including a vehicle electrical power source 20 operating at a first voltage level, an isolated power supply 22, an isolated electrical system 24, a controller 26 and converter circuit 28. In one arrangement, the vehicular electrical power source 20 is a typical direct current (DC) power source, or battery.

The isolated power supply 22 receives power from electrical power source 20 and converts it into an isolated DC output that supplies power to the converter circuit 28. The isolated nature of isolated power supply 22 ensures that there are no unintentional electrical paths to the chassis ground 99 of vehicular power source 20. Isolated power supply 22 may include an inverter circuit, a transformer and rectifier circuitry to provide the DC output of isolated power supply 22.

The isolated electrical system 24 is illustrated in FIG. 2 as a DC system having two electrical buses: a first bus or lower voltage level voltage bus and a second bus or higher voltage level bus, where the lower voltage level is lower than the higher voltage level. It is recognized that the present invention is also applicable to alternating current (AC) bus systems and electrical systems having more than two buses. The measuring circuit 77 or detector 50 is well suited for detecting leakage current to the chassis reference or ground 99 that might occur from the various elements of isolated electrical system 24, such as the windings of an alternator 30 (or generator), windings of electrical motors, inverters, converters, or loads (32, 34) that may drive the electrical motors and other loads connected to the buses of isolated electrical system 24.

As shown in FIG. 2, the isolated electrical system 24 operates at a higher electrical voltage than vehicular electrical power source 20. An advantage of the high voltage bus and higher voltage supply system is that more power can be distributed efficiently utilizing smaller gauge wiring, thereby saving weight and cost of investment of the electrical distribution system. The isolated electrical system 24 includes an alternator 30, illustrative loads 32 and 34, second buses 36 and 38, with isolation resistors 40 and 42 interfacing with converter circuit 28. Alternator 30 is driven by the mechanical rotational energy provided by an internal combustion engine (not shown) either directly through a mechanical linkage or indirectly by way of intermediate system, such as a hydraulic system.

The alternator 30 may comprise an electrical alternator for generating electrical energy, where the second bus is operating at alternating current. In an alternate embodiment, the alternator may comprise a generator, where the second bus is operating at direct current. Loads 32 and 34 are illustrated as loads across buses 36 and 38. The electrical loads 32 and 34 may be resistive, capacitive and/or inductive in nature, which may in some manner alter the characteristics of electricity on buses 36 and 38. The loads (32, 34) receive electrical energy via buses 36 and 38. If loads 32 and 34 are defective or contain short circuits, the loads can potentially contribute to a leakage path to chassis reference or ground 99.

Figure 3:
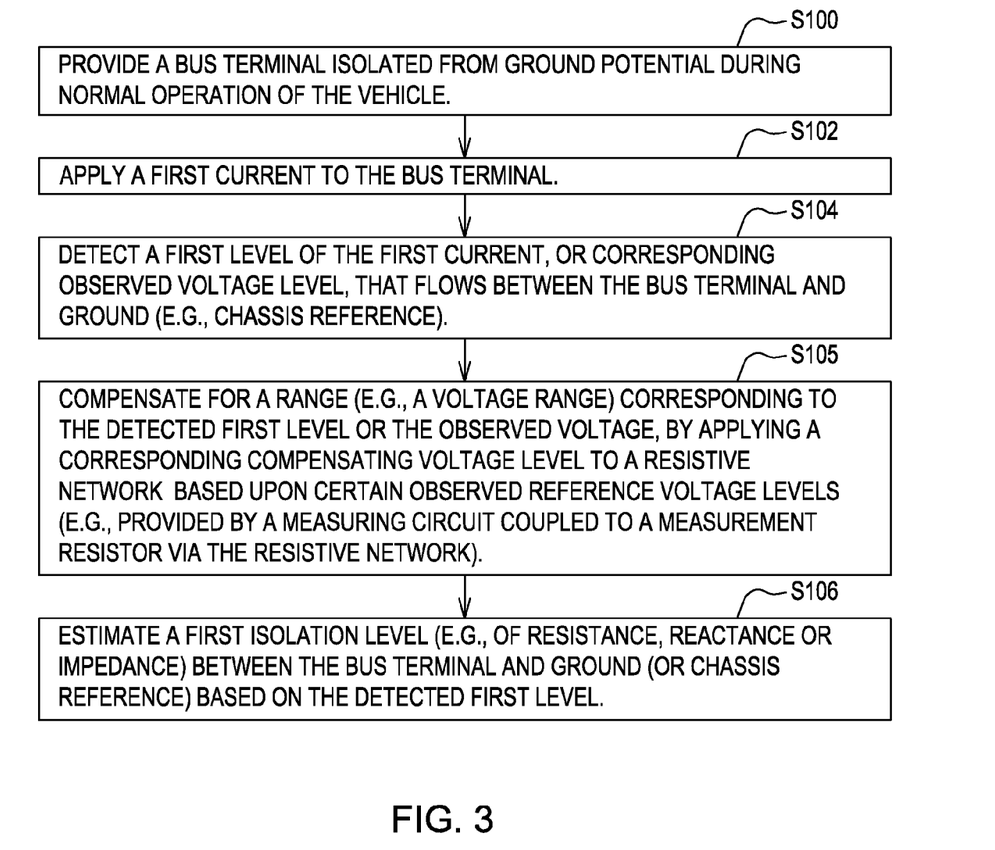
FIG. 3 is a flow chart of a first example of a method for determining electrical isolation detection between a voltage bus terminal and ground (or chassis reference).

In FIG. 3, a first leakage resistance 214 (R14), a second leakage resistance (R15), a first leakage capacitance 218, and a second leakage capacitance 219 are not electrical elements of isolated electrical system 24, but are merely illustrated to show the schematic equivalence of leakage paths that may occur between either bus 36 or bus 38 and the chassis ground 99. The above leakage resistances and leakage capacitances will be utilized to illustrate the detection of leakage from buses 36 and 38 through the chassis ground 99 and the way in which the insulation resistance can be calculated. Ideally, the first leakage resistance 214 and the second leakage resistance 215 would be infinite and equivalent leakage capacitances would be zero in a perfect operating system. The combination of first leakage resistance 214 (R14) and leakage capacitor 218 and the combination of second leakage resistor 215 (R15) and leakage capacitor 219 represent the impedance of the conduction paths between the corresponding bus and chassis 12. While isolated electrical system 24 is referred to as being isolated it is understood that leakages to chassis reference or ground 99 might occur, the reference to system 24 as being isolated is to be understood as being substantially electrically isolated from chassis reference and ground 99.

The converter circuit 28 includes switching devices 44 and 46 that selectively provide a conductive path from the positive and negative outputs of isolated power supply 22 to the junction of resistors 40 and 42, which serve as an isolation circuit. The switching devices may comprise power field effect transistors, rectifiers, Zener diodes, high impedance transistors, or other semiconductor devices, for example. While isolated power supply 22 has positive and negative voltage outputs, the negative output can be zero volts and the positive output is a positive voltage relative to the zero volts and may be at the first voltage level (e.g., equal to that of the output of the electrical power source 20 or isolated power supply output).

The timing circuit 48 comprises a first flip-flop 223 cascaded with a second flip-flop 224. The timing circuit 48 includes biasing devices, such as a resistor 212 (R12) and capacitor 216 (C1) that are connected in parallel with resistor 213 (R13) and capacitor 217 (C2). The functions of timing circuit 48 may alternatively be carried by a clock or signal generator (e.g., square wave generator) in another embodiment of the present invention. Resistors 40 and 42 are, for the purposes of discussion, considered to be high resistance matched values, such as 500 kilo-ohms, but different values and unmatched resistors are also contemplated as alternate embodiments of the present invention.

Because the semiconductors (44, 46) have oppositely type channels (e.g., N-type versus P-type, or enhancement mode versus depletion mode) and are connected to the signals outputted by the timing circuit 48, the timing circuit 48 causes the switching devices 44 and 46 to be in opposite states of conduction or activity depending upon the output of timing circuit 48. The timing circuit 48, in combination with switching devices 44 and 46, are configured to conduct a positive output of isolated power supply 22 to the junction of resistors 40 and 42 and then the negative output (e.g., or zero volt output) of isolated power supply 22 is connected to that junction when timing circuit 48 is in an opposite timing mode. In one embodiment, the output of timing circuit 48 can be considered to be an alternating current, square wave or another suitable waveform, thereby causing a square wave of the voltage levels from isolated power supply 22, consisting of the two voltage extremes, to be applied to the junction of resistors 40 and 42.

FIG. 3 illustrates a first example of a method for detecting electrical isolation between a bus terminal 21 and a ground 99 (or vehicle chassis.) The method of FIG. 3 begins in step S100.

In step S100, a bus terminal 21 is provided that is isolated from ground 99 potential (or chassis potential) during normal operation of a vehicle. For example, the isolated power supply 22 or power source 20 that is associated with vehicle electronics may comprise an isolated power supply 22 with positive and negative direct current terminals that are electrically isolated from the ground 99 or vehicle chassis by a known resistance, impedance or reactance.

In step S102, the electrical power source 20 or power supply 22 applies a first current or voltage to the bus terminal 21, or the vehicle bus.

In step S104, the detector 50 or measuring circuit 77 detects a first level of the first current, or derives it from a corresponding observed voltage, that flows or exists between the bus terminal 21 and ground 99 (e.g., chassis reference). For example, the detector 50 may measure a current level or corresponding observed voltage level associated with a measurement resistor 69 and a measurement capacitor 68 connected in parallel between the bus terminal 21 and ground 99.

Step S104 may be carried out in accordance with various techniques that may be applied alternately or cumulatively. Under a first technique, the first level of the current, or its corresponding observed voltage level, is estimated, partially or wholly, or at certain regular or periodic intervals, without compensation (e.g., without application of compensating voltage levels, Offset A, Offset B, or both). If the first level of the current, or its corresponding observed voltage level, is estimated without compensation, the first level of the current, or its observed voltage level, may be outside (e.g., higher than) a desired target range of current or voltage, whereas if the first level or second level of the current, or its corresponding observed voltage level is estimated with compensation, the first level of the current or its observed voltage level may be within the desired target range of current or voltage. However, the first current may change or flow to a greater extent when a short circuit, a ground fault, or degraded isolation is present between the bus terminal 21 and ground 99 (or the chassis reference).

Under a second technique, the detector 50 or measuring circuit 77 detects a derivative of, range-limited, or stepped-down level (e.g., a second level) of the first current (after or during compensation) that flows or exists between the bus terminal and ground 99 (or the chassis reference). For example, in the alternate embodiment, the detector 50 may detect a first level (or a second level) of the first current, or the corresponding observed voltage level, while the data processing system 61 compensates or controls compensation for a range in the detected first level by applying corresponding compensating voltage levels to a primary resistor (e.g., resistor 205) and a secondary resistor (e.g., resistor 202) of the resistive network 75. The measurement resistor 69 and resistive network 75 may be configured to adjust or divide one or more compensating voltage levels provided to the detector 50.

Under a third technique, the detector 50 or measuring circuit 77 detects a derivative of or change in the first level of the first current, or corresponding observed voltage level, without or prior to compensation and with or during compensation. The derivative or change in the first level of the first current, or change in the observed voltage levels may be represented by the difference between a compensated and uncompensated measurement, for instance.

Under a fourth technique, the detector 50 detects the first level, or corresponding observed voltage levels, and the data processor 62 determines the corresponding first level of the first current based upon certain observed reference voltage levels versus the corresponding currents of the first level stored as relationship data 81 in at least one of a look-up table, an equation, a file, data database, and a data record.

Step S105 may be executed before, during or after step S104. In one example, step S105 is executed simultaneously with step S104. In step S105, a data processor 62 or compensator 79 compensates for a range in the detected first level, or the observed voltage, by applying a corresponding compensating voltage level to a resistive network 75 based upon certain observed reference voltage levels (e.g., provided by measuring circuit 77 coupled to a measurement resistor 69 via the resistive network 75).

Figure 6:
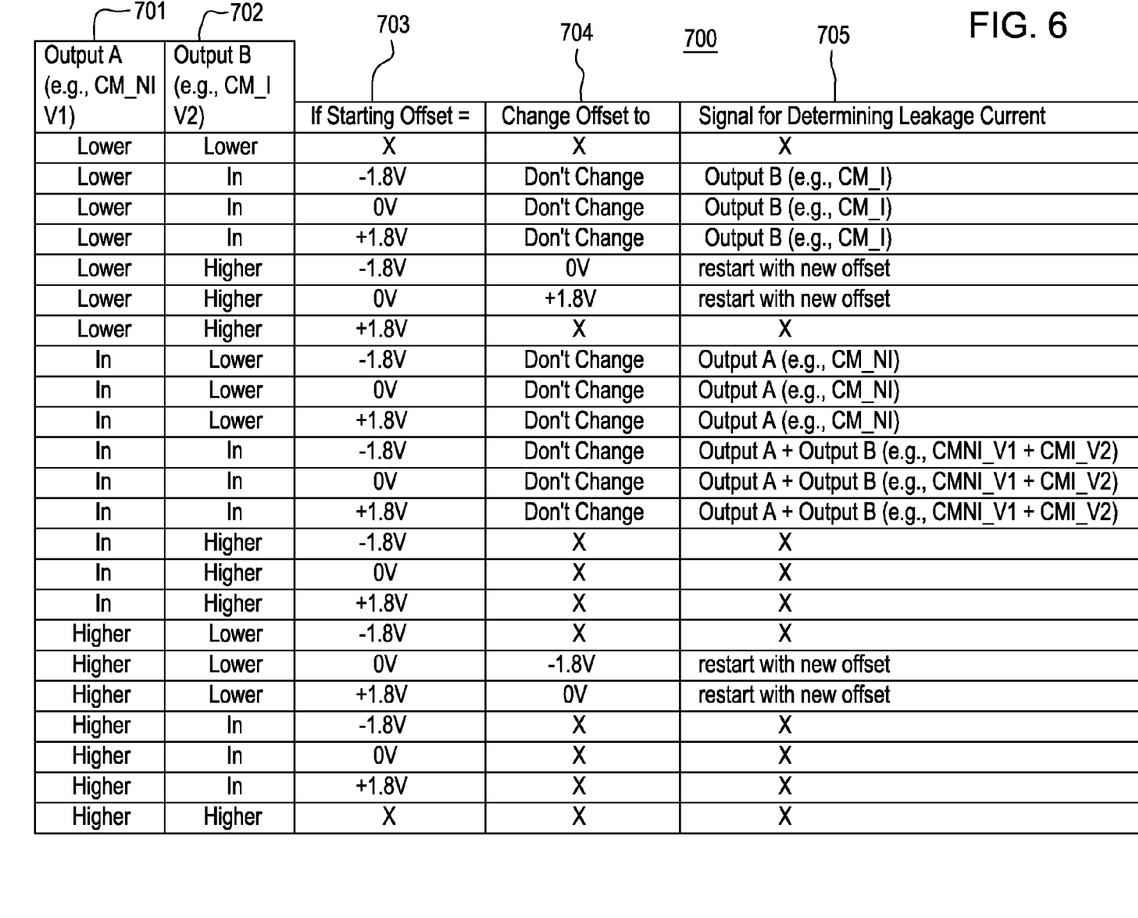
FIG. 6 is a table that provides logic for applying compensation voltage offset during measurement of current between the power source and ground.

Step S105 may be carried out by various techniques that may be applied alternately or cumulatively. Under a first technique, the data processor or compensator 79 may send a control data message or a control signal to a switching circuit 83 (or optional switching circuit 83 in FIG. 1) that is responsive to the control data message or the control signal, where the compensating voltage level is based on one or more outputs of the measuring circuit 77 as the certain observed voltage levels. The data processor 62 or compensator 79 may store relationship data 81 between the certain observed voltage levels and compensating voltage levels to determine the compensating voltage levels. FIG. 6 provided an illustrative example of such relationship data 81 that may be stored in the data storage device 64 of the data processing system. The switching circuit 83 applies or selects a discrete voltage level or particular digital logic level outputted by a power supply 84 (or optional power supply 84 in FIG. 1) as the compensating voltage level or offset voltage for application to the resistive network 75. The compensating voltage levels are well suited toward using the existing voltage input range of the analog-to-digital converter 52 to handle a greater than otherwise possible voltage range of voltages provided by one or more outputs of the measuring circuit 77, the detector 50, or both.

Under a second technique, a data processor 62 or compensator 79 compensates for a range in the detected first level, or the observed voltage, by applying corresponding compensating voltage levels to a primary resistor (e.g., 205) in a resistive network 75 and to a secondary resistor (e.g., 202) in the resistive network 75 based upon certain observed reference voltage levels (e.g., provided by measuring circuit 77 coupled to a measurement resistor 69 via the resistive network 75). The data processor or compensator 79 may store relationship data 81 between the certain observed voltage levels and compensating voltage levels to determine the compensating voltage levels.

In step S106, the data processor 62 or evaluator 65 estimates a first isolation level (e.g., resistance, reactance or impedance) between the bus terminal 21 and ground 99 (or chassis reference) based on the detected first level. For example, the first isolation level may be estimated based on one or more of the following: (1) value of the measurement resistor 69 and the observed voltage across the measurement resistor, (2) the measured current that flows through resistor 69, (3) a derivative or stepped-down version of the measured current that flows through resistor 69, (4) a derivative or change in the measured current that flows through the resistor, where the change is measurement in a first state without any ground fault or degraded isolation and in a second state with a ground fault or degraded isolation between the bus terminal 21 and the ground 99 (or chassis reference).

Figure 4:
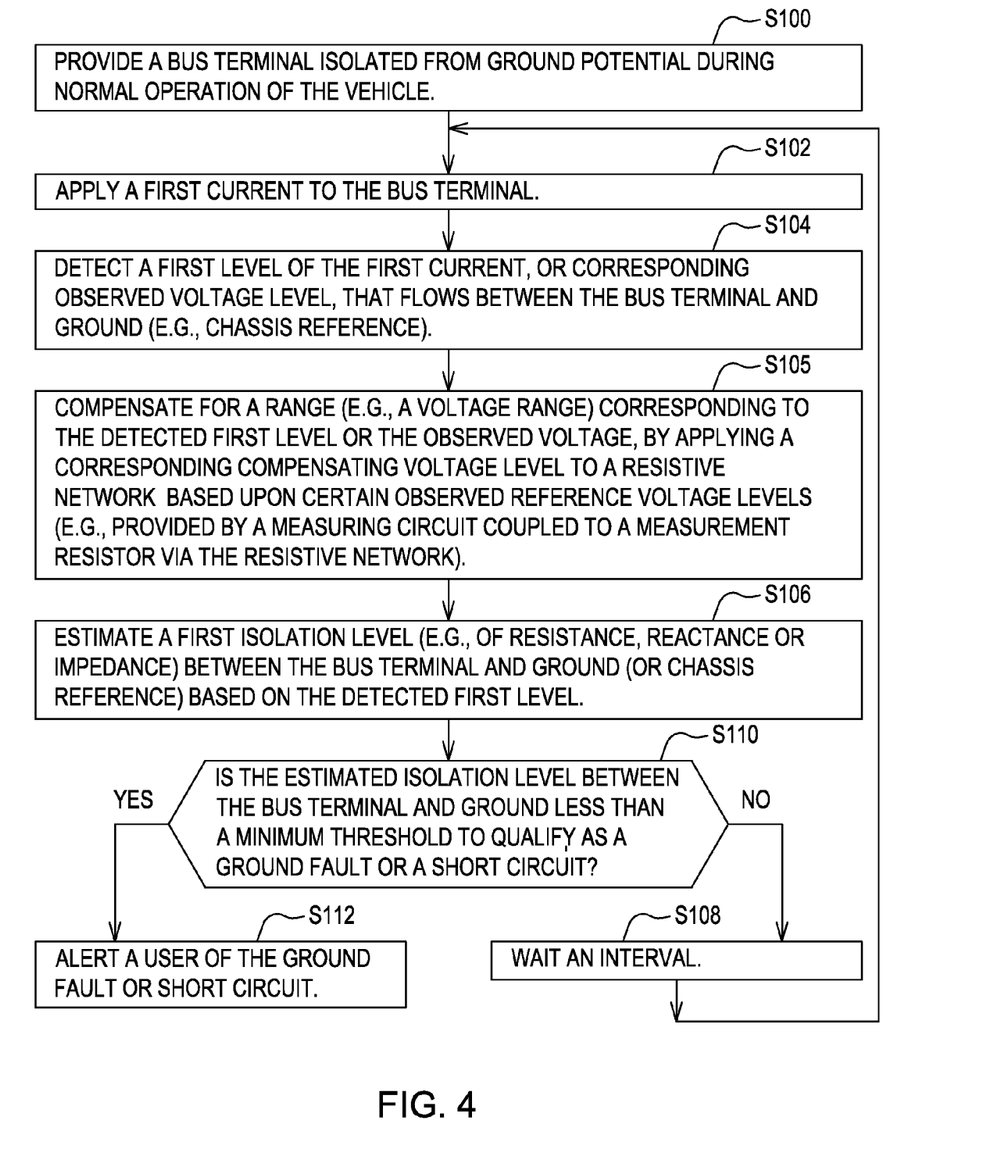
FIG. 4 is a flow chart of a second example of a method for determining electrical isolation detection between a voltage bus terminal and ground (or chassis reference).

FIG. 4 illustrates a second example of a method for detecting electrical isolation between a bus terminal 21 and a ground 99 (or vehicle chassis.) The method of FIG. 4 is similar to the method of FIG. 3, except the method of FIG. 4 further comprises step S110, S108 and S112. Like reference numbers in FIG. 3 and FIG. 4 indicate like steps or procedures.

Step S110 may be executed after or during step S106. In step S110, the data processor 62 or evaluator 65 determines whether the estimated isolation level (e.g., resistance or impedance) between the bus terminal 21 and ground 99 (or the vehicle chassis) is less than a minimum threshold to qualify as a ground 99 short or a short circuit. For example, the minimum threshold may comprise twenty-five thousand ohms, or another suitable lower measurement of resistance that indicates a short circuit in one or more electrical devices, or electromechanical devices or loads (32, 34) associated with the vehicle electrical system. The minimum threshold may change with the electrical characteristics of the components used in the electrical vehicle system. For example, the electrical motor may have normal resistance levels or ranges for the stator or rotor windings, where the minimum threshold would be set such that such normal resistance ranges would generally be above the minimum threshold. Similarly, the generator or alternating may have normal resistance levels or ranges for its windings, where the minimum threshold would be set such that such normal resistance ranges would generally be above the minimum threshold. If the estimated isolation between the bus terminal 21 and ground 99 is less than a minimum threshold, the method continues with step S112. However, if the estimated isolation between the bus terminal 21 and ground 99 is greater than a minimum threshold, the method continues with step S108.

In step S112, an interface 67 (e.g., user interface) alerts a user of a ground fault or short circuit. Step S112 may be carried out by various techniques that may be applied alternately or cumulatively. Under a first technique, the interface 67 provides a visual or audible alert or notification of the ground fault or short circuit to the user. Under a second technique, the interface 67 transmits a data message or status message indicative of the ground fault or short circuit to a controller, computer, or other network device via the vehicle data bus and the network device provides a visual or audible alter or notification of the ground fault or short circuit to the user. Under a third technique, the interface 67 transmits a data message or status message indicative of the ground fault or short circuit to a wireless communications device via the vehicle data bus or otherwise, and the wireless communications device forwards a corresponding wireless data message to an base station for processing by an operator, a service technician or otherwise.

In step S108, the data processing system or data processor waits an interval (e.g., a time period) prior to returning to step S102.

Figure 5:
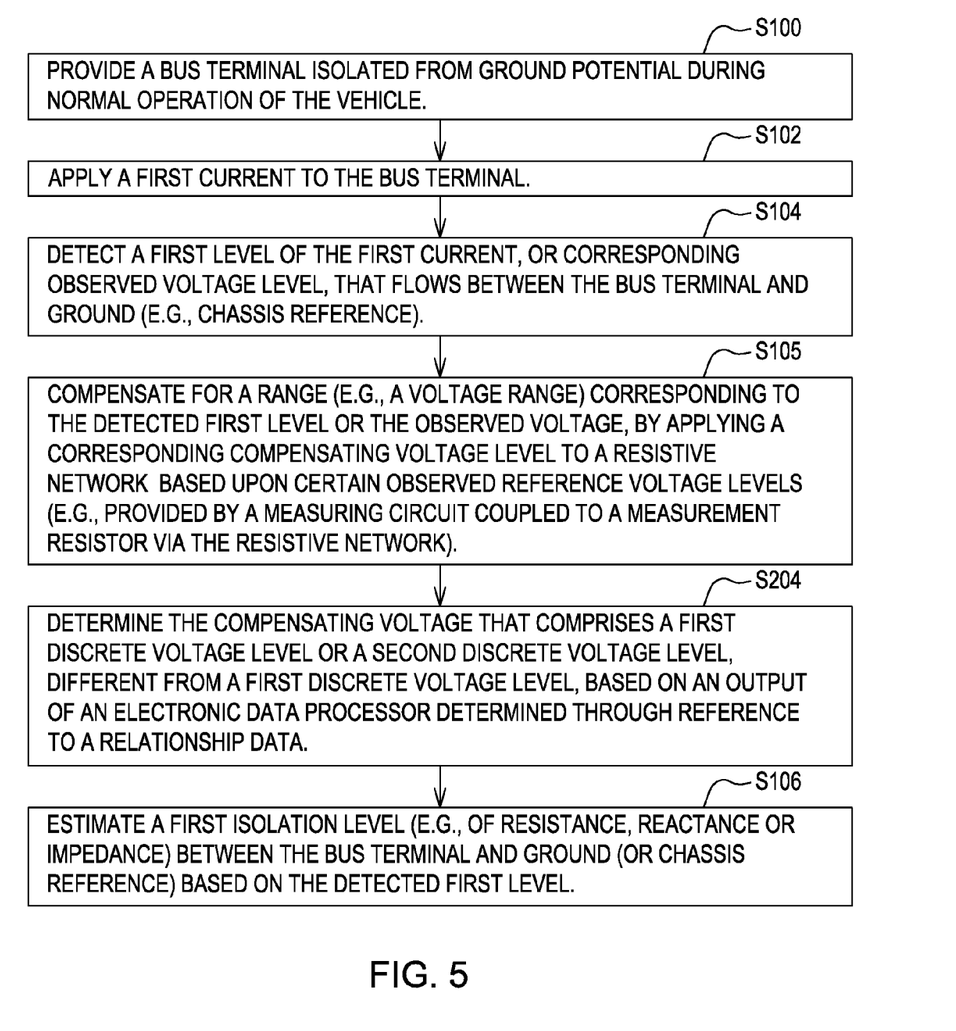
FIG. 5 is a flow chart of a third example of a method for determining electrical isolation detection between a voltage bus terminal and ground (or chassis reference).

FIG. 5 illustrates a second example of a method for detecting electrical isolation between a bus terminal 21 and a ground 99 (or vehicle chassis.) The method of FIG. 5 is similar to the method of FIG. 3, except the method of FIG. 5 further comprises step S204. Like reference numbers in FIG. 3 and FIG. 5 indicate like steps or procedures.

Step S204 may be executed before, during or after step S105. In Step S204, the data processor 62 or data processing system 61 determines the compensating voltage, which comprises a first discrete voltage level, or a second discrete voltage level, different from a first discrete voltage level, based on an output of an electronic data processor 62 determined through reference to relationship data 81 (e.g., look up table of FIG. 6).

FIG. 6 illustrates relationship data 81 between outputs of the measurement circuit and compensating voltage levels. Although the relationship data 81 is illustrated as a look-up table 700 or logic table, the relationship data 81 may be expressed in other forms, such as one or more data records, files, inverted files, or a database, set of rules, if-then rules, or otherwise.

The relationship data 81 of FIG. 6 may be used within any of the embodiments of the system or method set forth in other drawings. The references to Outputs A, B and C, and Offsets A and B in FIG. 1, FIG. 2 and FIG. 7 indicate like elements, features or signals. Similarly, in FIG. 2, Outputs A, B, and C are presented by measuring circuit 77 to the analog-to-digital converters 52, whereas Offsets A & B are available from the input/output data ports 66 or data processor 62 of the data processing system 61 to the resistive network 75.

FIG. 6 is organized into columns. The first column 701 and second column 702 indicate that voltage status of Output A and Output B, respectively. In FIG. 6, "lower" means that a current voltage sample compared to a moving average, mean, or prior voltage sample at Output A or Output B is lower or trends lower, whereas "higher" means that a current voltage sample compared to a moving average, man, or prior voltage sample at Output A or Output B is higher or trends higher. Further in one example in the first column 701, Output A is measured in the charging mode, whereas in the second column 702 output B is measuring in the discharging mode. Recall that in the charging mode charge is added to the vehicle bus (e.g., direct current data bus), whereas in the discharging mode charge is depleted from the vehicle bus.

The third column 703 provides examples of compensating voltage levels or offsets. Here, three discrete voltage levels are presented, although as few as two discrete voltage levels could be used. The actual voltage levels selected for the offset (e.g., Offsets A, B, or both) depend upon the operating range of the analog-to-digital converter 52, the configuration of the measuring circuit 77 and expected or typical values of Outputs A, B and C, without compensation or prior to compensation, among other things. Although the offsets are illustrated as −1.8 volts, 0 volts, and +1.8 volts in other embodiments that fall under the scope of the claims, other values of compensating voltages may be used.

The first column through the fourth column (701, 702, 703 and 704) are considered collectively, where jointly the columns (701, 702, 703, and 704) form if-then rules for changing the next offset based on a prior offset and corresponding observed voltages at Output A and Output B. 0 volts is essentially uncompensated or with no offset. X refers to a don't care state, where presented in any of the rows and columns of FIG. 6. The last column 705 provides the measured signals or observed voltage levels from the measuring circuit 77 to use for detection of the leakage current. The leakage current may be estimated from Output B alone, Output A, or an additive combination of Output B and Output A. Where Output A and Output B are combined, Output A may be evaluated in the charging mode, whereas Output B may be evaluated in the charging mode. Although Output C is not used in the chart for FIG. 6, Output C can be used in the measurements for calibration, or for the V1 and V2 readings in the lookup table of FIG. 6. In alternative embodiments, Output C may be used in lieu of or in cumulatively with Output A and Output C in an alternate look-up table to that illustrated in FIG. 6.

Having described the preferred embodiment, it will become apparent that various modifications can be made without departing from the scope of the invention as defined in the accompanying claims.

The following is claimed:

1. A method for detecting electrical isolation between a bus terminal and ground, or chassis reference, on a vehicle, the system comprising:

providing a bus terminal isolated from the ground and chassis reference during normal operation of the vehicle;

applying a first current to the bus terminal;

detecting a first level of the first current, or a corresponding observed voltage level based on the first current, that flows or exists from the bus terminal to ground, by compensating for a range in the detected first level by applying a corresponding compensating voltage level to a resistive network coupled to a level detector for detecting the first level based upon certain observed reference voltage levels; and estimating a first isolation level between the bus terminal and the ground, or the chassis reference, based on the detected first level, wherein the compensating voltage places the first level within a target measurement range for detection by the level detector, where the target measurement range is consistent with an input voltage range of an analog-to-digital converter coupled to the level detector.

2. The method according to claim 1 wherein the detecting a first level of the first current, or the corresponding observed voltage level, further comprises:

compensating for a range in the detected first level by applying corresponding compensating voltage levels to a primary resistor and a secondary resistor of the resistive network.

3. The method according to claim 1 further comprising:

providing a measurement resistor and a measurement capacitor connected in parallel between the bus terminal and ground, where the measurement resistor and resistive network adjust or divide the compensating voltage level provided to the level detector.

4. The method according to claim 1 wherein the detecting of the first level is based upon certain observed reference voltage levels versus the corresponding currents of the first level stored as reference data in at least one of a look-up table, an equation, a file, data database, and a data record.

5. The method according to claim 1 wherein the estimating a first isolation level is based upon a corresponding compensating voltage level stored as reference data in at least one of a look-up table, a file, database, and a data record.

6. The method according to claim 1 further comprising:
determining whether the estimated first isolation level between the bus terminal and ground exceeds a minimum threshold to qualify as a ground fault or a short circuit.

7. The method according to claim 6 further comprising:
alerting a user of the ground fault or short circuit, the alerting carried out via a visual alert or an audible alert of a user interface.

8. The method according to claim 1 further comprising:
applying a first discrete voltage level or second discrete voltage level, different from a first discrete voltage level, as the compensating voltage level to the resistive network based on an output of an electronic data processor determined through application of relationship data to outputs of a measuring circuit.

9. The method according to claim 8 wherein the relationship data comprises at least one of a look-up table, a file, database, and a data record.

10. The method according to claim 1 further comprising:
detecting a second level of the first current, or the first derivative current, while the compensating voltage level is applied.

11. A system for detecting electrical isolation between a bus terminal and ground, or the chassis reference, on a vehicle, the system comprising:
a bus terminal isolated from the ground and chassis reference during normal operation of the vehicle, a first current applied to the bus terminal;
a detector for detecting a first level of the first current, or a corresponding observed voltage, based on the first current, that flows or exists from the bus terminal to ground;
a compensator for compensating for a range in the detected first level by applying a corresponding compensating voltage level to a resistive network coupled to the detector, the compensating voltage levels determined based upon certain observed reference voltage levels, wherein the compensating voltage level places the first level within a target measurement range for detection by the detector, where the target measurement range is consistent with an input voltage range of an analog-to-digital converter coupled to the level detector; and
an electronic data processor for estimating a first isolation level between the bus terminal and ground based on the detected first level.

12. The system according to claim 11 wherein:
the resistive network comprises a primary resistor and a secondary resistor associated with corresponding inputs of the detector,
the compensator configured to compensate for a range in the detected first level by applying corresponding compensating voltage levels to the primary resistor and the secondary resistor of the resistive network.

13. The system according to claim 11 further comprising:
a measurement resistor;
a measurement capacitor connected in parallel to the measurement resistor to form a circuit, the circuit connected between the bus terminal and ground, where the measurement resistor and the first resistor form a voltage divider for application of a compensating current to the level detector.

14. The system according to claim 11 further comprising:
a measuring circuit coupled to the resistive network, the measuring circuit providing or outputting the certain observed reference voltage levels;
a data storage device for storing compensating voltage levels versus the certain observed reference voltage levels from a measuring circuit in relationship data.

15. The system according to claim 11 wherein the data processor is capable of determining that the estimated isolation level between the bus terminal and ground exceeds a minimum threshold and qualifies as a ground fault or a short circuit.

16. The system according to claim 15 further comprising:
a user interface capable of communicating with the data processor, the user interface arranged to alert a user of the ground fault or short circuit via a visual alert or an audible alert of the user interface.

17. The system according to claim 11 wherein the compensator further comprises:
a data storage device for storing relationship data on a relationship between observed reference voltage levels and corresponding compensating voltage levels;
a data port for applying a first discrete voltage level or a second discrete voltage level, different from the first discrete voltage level, as the compensating voltage level, to the detector based on an output of the data processor determined through application of the relationship data.

18. A method for detecting electrical isolation between a bus terminal and ground, or chassis reference, on a vehicle, the system comprising:
providing a bus terminal isolated from the ground and chassis reference during normal operation of the vehicle;
applying a first current to the bus terminal;
detecting a first level of the first current, or a corresponding observed voltage level based on the first current, that flows or exists from the bus terminal to ground, by compensating for a range in the detected first level by applying a corresponding compensating voltage level to a resistive network coupled to a level detector for detecting the first level based upon certain observed reference voltage levels; and
estimating a first isolation level between the bus terminal and the ground, or the chassis reference, based on the detected first level, wherein the compensating voltage places the first level within a target measurement range for detection by the level detector to increase dynamic range of the electrical isolation detection, regardless of whether or not a ground fault or decrease in isolation is present.

* * * * *